United States Patent
Wideman et al.

(10) Patent No.: US 10,484,016 B2
(45) Date of Patent: Nov. 19, 2019

(54) DATA DEDUPLICATION WITH ADAPTIVE ERASURE CODE REDUNDANCY

(71) Applicant: Quantum Corporation, San Jose, CA (US)

(72) Inventors: Roderick B. Wideman, Shakopee, MN (US); Suayb Sefik Arslan, Irvine, CA (US); Jaewook Lee, Aliso Vlejo, CA (US); Turguy Goker, Irvine, CA (US)

(73) Assignee: Quantum Corporation, San Jose, CA (US)

( * ) Notice: Subject to any disclaimer, the term of this patent is extended or adjusted under 35 U.S.C. 154(b) by 246 days.

(21) Appl. No.: 15/602,726

(22) Filed: May 23, 2017

(65) Prior Publication Data

US 2017/0257119 A1    Sep. 7, 2017

Related U.S. Application Data

(63) Continuation of application No. 15/227,285, filed on Aug. 3, 2016, now Pat. No. 9,692,452, which is a
(Continued)

(51) Int. Cl.
*H03M 13/15* (2006.01)
*H03M 13/37* (2006.01)
(Continued)

(52) U.S. Cl.
CPC .......... *H03M 13/154* (2013.01); *G06F 3/064* (2013.01); *G06F 3/0619* (2013.01);
(Continued)

(58) Field of Classification Search
CPC ........... H03M 13/154; H03M 13/3707; H03M 13/3761; H03M 13/373; G06F 16/1752;
(Continued)

(56) References Cited

U.S. PATENT DOCUMENTS

| 7,161,506 B2 | 1/2007 | Fallon |
| 7,378,992 B2 | 5/2008 | Fallon |

(Continued)

OTHER PUBLICATIONS

Xiao, et al., "CodePlugin: Plugging Deduplication into Erasure Coding for Cloud Storage", Jul. 2015, HotCloud'15, 7th USENIX Workshop in Hot Topics in Cloud Computing, pp. 1-6.
(Continued)

*Primary Examiner* — James C Kerveros
(74) *Attorney, Agent, or Firm* — Eschweiler & Potashnik, LLC

(57) ABSTRACT

Example apparatus and methods combine erasure coding with data deduplication to simultaneously reduce the overall redundancy in data while increasing the redundancy of unique data. In one embodiment, an efficient representation of a data set is produced by deduplication. The efficient representation reduces duplicate data in the data set. Redundancy is then added back into the data set using erasure coding. The redundancy that is added back in adds protection to the unique data associated with the efficient representation. How much redundancy is added back in and what type of redundancy is added back in may be controlled based on an attribute (e.g., value, reference count, symbol size, number of symbols) of the unique data. Decisions concerning how much and what type of redundancy to add back in may be adapted over time based, for example, on observations of the efficiency of the overall system.

20 Claims, 11 Drawing Sheets

Related U.S. Application Data continuation of application No. 14/326,774, filed on Jul. 9, 2014, now Pat. No. 9,503,127.

(51) Int. Cl.
| | | |
|---|---|---|
| *G06F 11/14* | (2006.01) | |
| *G06F 3/06* | (2006.01) | |
| *G06F 11/10* | (2006.01) | |
| *G06F 16/174* | (2019.01) | |

(52) U.S. Cl.
CPC .......... *G06F 3/0641* (2013.01); *G06F 3/0673* (2013.01); *G06F 11/1076* (2013.01); *G06F 11/1453* (2013.01); *G06F 16/1752* (2019.01); *H03M 13/373* (2013.01); *H03M 13/3707* (2013.01); *H03M 13/3761* (2013.01)

(58) Field of Classification Search
CPC .... G06F 3/0641; G06F 3/0673; G06F 3/0619; G06F 11/1076; G06F 3/064; G06F 11/1453
USPC .......................................................... 714/766
See application file for complete search history.

(56) References Cited

U.S. PATENT DOCUMENTS

| | | |
|---|---|---|
| 7,415,530 B2 | 8/2008 | Fallon |
| 8,643,513 B2 | 2/2014 | Fallon |
| 9,054,728 B2 | 6/2015 | Fallon |
| 9,116,833 B1 | 8/2015 | Rakitzis et al. |
| 9,116,908 B2 | 8/2015 | Fallon |
| 9,292,384 B2 | 3/2016 | Jin et al. |
| 2004/0010742 A1 | 1/2004 | Williamson |
| 2006/0085726 A1 | 4/2006 | Rhee |
| 2006/0212782 A1 | 9/2006 | Li |
| 2007/0180295 A1 | 8/2007 | Byrne |
| 2008/0151724 A1 | 6/2008 | Anderson et al. |
| 2008/0155191 A1 | 6/2008 | Anderson et al. |
| 2009/0132619 A1 | 5/2009 | Arakawa |
| 2010/0153181 A1 | 6/2010 | Altunbasak |
| 2011/0066628 A1 | 3/2011 | Jayaraman |
| 2013/0036278 A1* | 2/2013 | Strzelczak .............. G06F 11/14 711/161 |
| 2014/0101512 A1 | 3/2014 | Djordjevic |
| 2014/0157079 A1 | 6/2014 | Park |
| 2014/0228077 A1 | 8/2014 | Xu |
| 2014/0372585 A1 | 12/2014 | Hui et al. |
| 2015/0058582 A1* | 2/2015 | Baldwin .................. G06F 3/06 711/158 |
| 2015/0236716 A1 | 8/2015 | Fukuda |
| 2015/0378820 A1 | 12/2015 | Doerner |
| 2017/0102993 A1 | 4/2017 | Hu |

OTHER PUBLICATIONS

IEEE 100, "The Authoritative Dictionary of IEEE Standards Terms", 2000, Seventh Edition, IEEE Standards Information Network, IEEE Press, pp. 1, 2, 124, 155, 168, 207, 273, 323, 574, 684.

Non-Final Office Action dated Jul. 12, 2018 in connection with U.S. Appl. No. 15/211,208.

Non-Final Office Action dated May 31, 2016 for U.S. Appl. No. 14/326,774.

Notice of Allowance dated Jul. 27, 2016 U.S. Appl. No. 14/326,774.

U.S. Appl. No. 15/211,208, filed Jul. 15, 2016.

Non-Final Office Action dated Oct. 5, 2016 for U.S. Appl. No. 15/227,285.

Notice of Allowance dated Feb. 27, 2017 for U.S. Appl. No. 15/227,285.

Notice of Allowance dated Jan. 28, 2019 in connection with U.S. Appl. No. 15/211,208.

\* cited by examiner

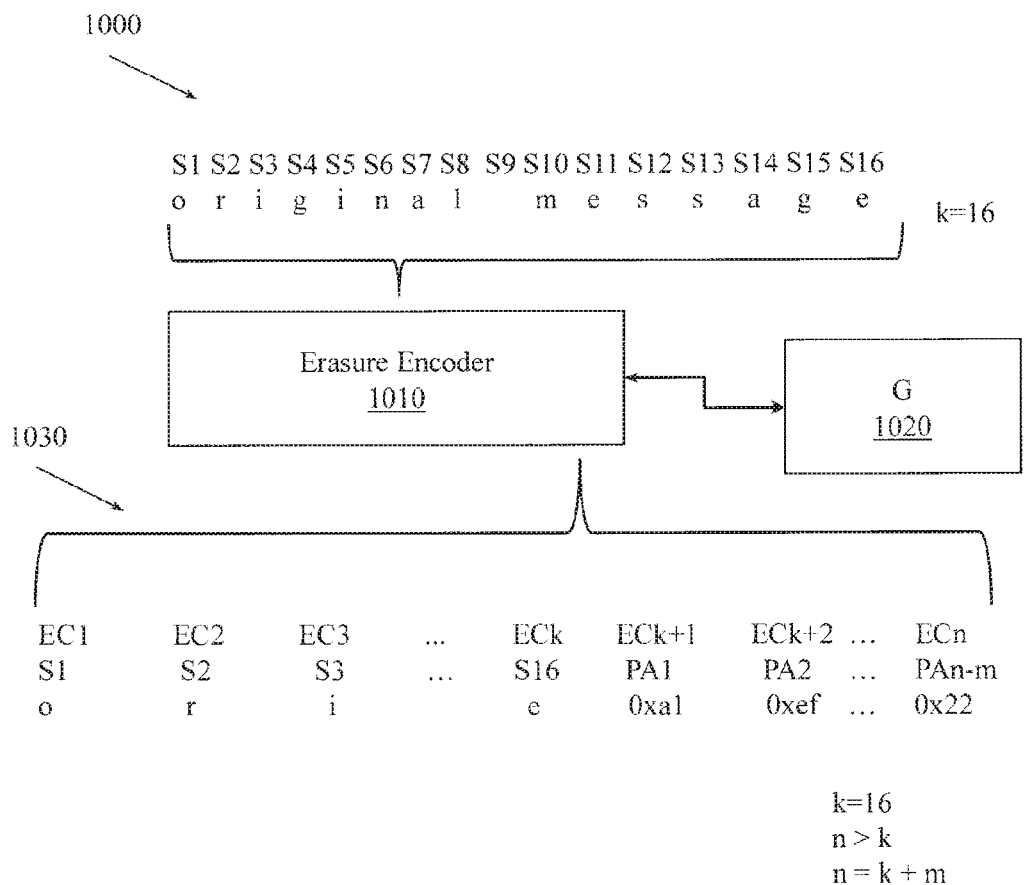
Prior Art Figure 10

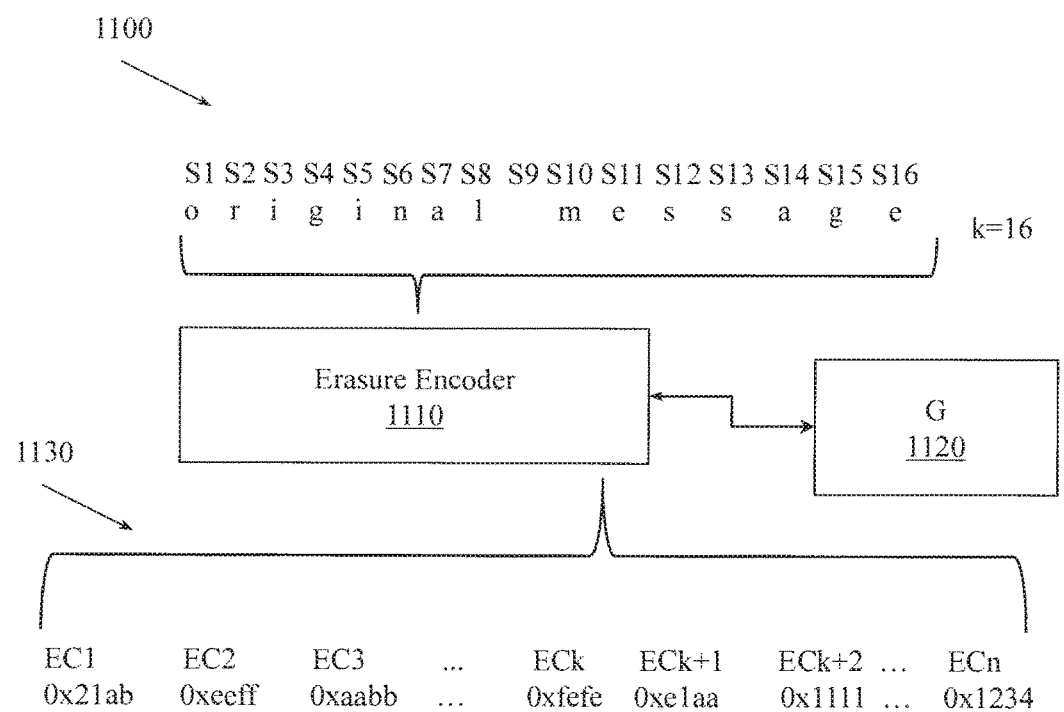
Prior Art Figure 11

DATA DEDUPLICATION WITH ADAPTIVE ERASURE CODE REDUNDANCY

REFERENCE TO RELATED APPLICATIONS

This Application is a Continuation of U.S. application Ser. No. 15/227,285 filed on Aug. 3, 2016, which is a Continuation of U.S. application Ser. No. 14/326,774 filed on Jul. 9, 2014 (now U.S. Pat. No. 9,503,127 issued on Nov. 22, 2016). The contents of the above referenced matters are hereby incorporated by reference in their entirety.

BACKGROUND

Data deduplication removes redundancy while erasure coding adds redundancy. Data deduplication represents an original set of symbols in a smaller set of code symbols while erasure coding represents an original set of symbols in a larger set of code symbols. Thus, conventionally there has been no reason to use deduplication and erasure coding together.

Data that is stored or transmitted may be protected against storage media failures or other loss by storing extra copies or by storing additional redundant information. One type of redundancy-based protection involves using erasure coding. Erasure coding creates additional redundant data to produce code symbols that protect against 'erasures' where data portions that are lost can be reconstructed from the surviving data. Adding redundancy introduces overhead that consumes more storage capacity or transmission bandwidth, which in turn adds cost. The overhead added by erasure code processing tends to increase as the protection level provided increases.

While erasure codes increase data storage requirements by introducing additional redundancy, data deduplication seeks to reduce data storage requirements by removing redundancy. Data deduplication seeks to remove redundancy within a data set by representing an original set of symbols in a smaller set of code symbols. By representing data with a reduced number of code symbols, data storage space and communication capacity use are improved, which may in turn reduce cost.

The lack of redundancy in deduplicated data causes some unique data identified during deduplication to be less protected than others with respect to storage media failure or other loss. Over time, some unique data may become more or less valuable than other unique data. For example, one piece of unique data may be used to recreate hundreds of documents while another piece of unique data may only be used to recreate a single document. While loss of the unique data that is used for one document would be bad, the loss of the unique data that is used in the hundreds of documents may be worse. In some cases, the loss of the unique data used to recreate even a single document may be catastrophic when the data concerns, for example, user authentication or system security.

To enhance data protection, different approaches for storing redundant copies of items have been employed. Erasure codes are one such approach. An erasure code is a forward error correction (FEC) code for erasure channels. The FEC facilitates transforming a message of k symbols into a longer message with n symbols so that the original message can be recovered from a subset of the n symbols, k and n being integers, n>k. The symbols may be individual items (e.g., characters, bytes) or groups of items. The original message may be, for example, a file. The fraction r=k/n is called the code rate, and the fraction k'/k, where k' denotes the number of symbols required for recovery, is called the reception efficiency or coding overhead. Optimal erasure codes have the property that any k out of the n code word symbols are sufficient to recover the original message (e.g., coding overhead of unity). Optimal codes may require extensive memory usage, CPU time, or other resources when n is large. Erasure coding approaches may seek to create the greatest level of protection with the least amount of overhead via optimal or near optimal coding. Different types of erasure codes have different efficiencies and tradeoffs in terms of complexity, resources, and performance.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure codes.

Fountain codes have the property that a potentially limitless sequence of code symbols may be generated from a given set of source symbols in a manner that supports ideally recovering the original source symbols from any subset of the code symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k (e.g., an overhead close to unity). A rateless erasure code is distinguished from an erasure code that exhibits a fixed code rate.

Storage systems may employ rateless erasure code technology (e.g., fountain codes) to provide a flexible level of data redundancy. The appropriate or even optimal level of data redundancy produced using a rateless erasure code system may depend, for example, on the number and type of devices available to the storage system. The actual level of redundancy achieved using a rateless erasure code (EC) system may depend, for example, on the difference between the number of readable redundancy blocks (e.g., erasure code symbols) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable.

An EC system may be described using an A/B notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified encoded symbols.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior Art FIG. 10 illustrates an example set of systematic erasure codes.

Prior Art FIG. 11 illustrates an example set of non-systematic erasure codes.

DETAILED DESCRIPTION

Figure 1:
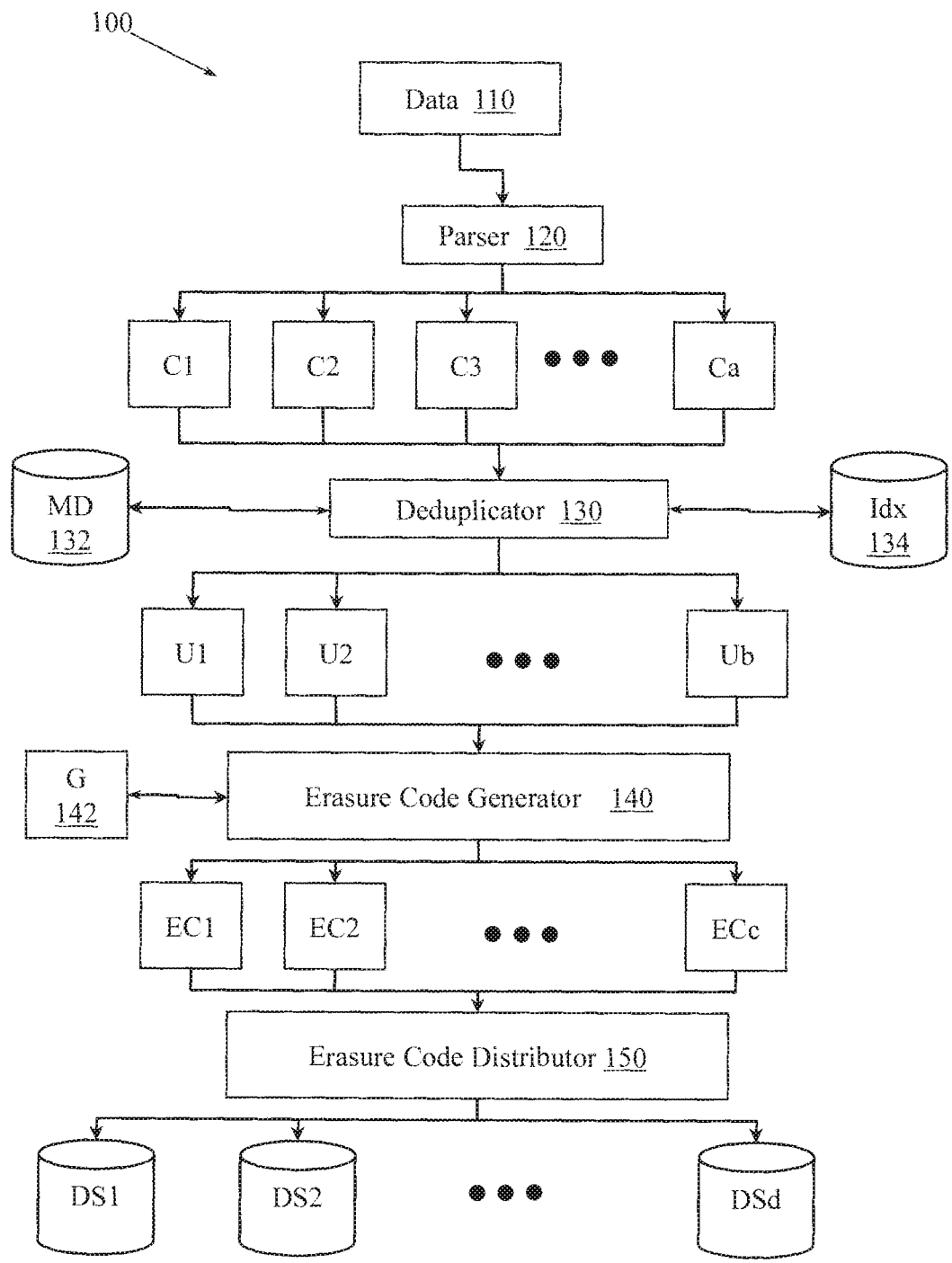
FIG. 1 illustrates an example of protecting unique chunks produced by a data deduplication system using erasure code redundancy.

Example apparatus and methods combine data deduplication with erasure coding to reduce the amount of data that is erasure coded while adding protection for unique data produced by data deduplication. Since not all unique data may have the same value—whether real or perceived—to a deduplication system, example apparatus and methods account for varying levels of importance of unique data. Varying levels of importance are accounted for by dynamically adapting erasure code generation approaches.

Example apparatus and methods may identify redundancy policies to be employed based on attributes of unique data produced by a deduplication system. For example, an erasure code approach may provide greater protection to unique data that has a higher value. The value may be determined from some attribute of the unique data (e.g., reference counts). The redundancy policies may identify, for example, M/N policies that control the number of erasure code symbols generated and the distribution of those symbols. In one embodiment, M and N may be manipulated based on an attribute of the unique data. In one embodiment, the amount of additional information (e.g., parity) that is added to create an encoded codeword symbol may be a function of an attribute of the unique data. In one embodiment, the size of an erasure code symbol (e.g., number of bits, number of bytes) may be a function of an attribute of the unique data. In one embodiment, while N erasure code symbols may be generated, example apparatus and methods may control how many of the N erasure code symbols are stored based on an attribute of the unique data. The erasure code symbols may be stored on a single device or may be distributed between two or more devices. The number of devices to which erasure code symbols are distributed may also be a function of an attribute of the unique data.

Example apparatus and methods may vary the erasure code approach for certain data over time. For example, as certain data becomes more valuable, the number of erasure code symbols used to protect that data may be increased. Conversely, as other data becomes less valuable, the number of erasure code symbols used to protect that data may be decreased. Conventional systems, if it were even possible to try to modify them to try be adaptive over time, would be required to compute entirely new sets of erasure codes. Unlike conventional systems, new erasure code symbols may be computed and added to existing codes without computing entirely new sets of erasure codes. Additionally, unlike conventional systems, some erasure code symbols may be deleted, either physically or logically, without having to compute new erasure code symbols.

Rateless erasure codes may be well-suited for this application of adaptively varying erasure code protection over time based on a property (e.g., value, reference counts) of the data being protected. When rateless erasure codes are employed, additional rateless erasure code symbols (e.g., parities) may be generated and stored as data value increases (e.g., number of references goes up). The additional rateless erasure code symbols may be generated using the same generator matrix that was used to generate the original rateless erasure codes. The original rateless erasure codes do not need to be deleted or overwritten.

As data value decreases (e.g., number of references goes down), some original rateless erasure code symbols may be deleted, either logically or physically. An erasure code symbol may be logically deleted by, for example, erasing a pointer value in memory. Logically erasing an erasure code symbol rather than physically erasing the erasure code symbol may reduce stress on data storage devices (e.g., disk drives) that are used to store erasure codes.

Different types of erasure coding and data deduplication may combine in different ways. Systematic erasure codes do not incur a decode penalty when reading back data that has not encountered any erasures (e.g., no data has been corrupted or lost) since some of the encoded symbols are actually just the plaintext symbols from the original message. When no data has been lost, decoding can be avoided, which helps performance. Rateless erasure codes handle large data objects well, are flexible for adapting to different levels of protection, and are reliable against random, distributed errors. Thus, example apparatus and methods may employ systematic erasure codes, rateless erasure codes, or even systematic rateless erasure codes. Other forms of erasure codes may also be employed.

Variable-length, block-level data deduplication exhibits superior performance in some deduplication applications. For example, variable-length, block-level data deduplication quickly adapts to a data stream and synchronizes to data segments that have occurred elsewhere regardless of whether data has been inserted or removed. Variable-length, block-level data deduplication can be performed 'in-line' where all data does not need to be seen first or may be performed in post-processing. While variable-length, block-level deduplication is described, other types of deduplication may be combined with various forms of erasure coding.

Prior Art FIG. 10 illustrates an original message 1000 that has sixteen symbols S1, S2, . . . S16 (k=16) and that reads "original message". While the symbol size is one character, different symbol sizes may be employed. Message 1000 is provided to erasure encoder 1010. Erasure encoder 1010 uses a generator matrix 1020 to produce erasure code symbols 1030. In this example, erasure encoder 1010 produces systematic erasure code symbols EC1, EC2, . . . ECn (n>k). The systematic erasure code symbols include EC1 . . . EC16 (EC1 . . . ECk), which correspond directly to S1 . . . S16 (S1 . . . Sk). In this embodiment, at least EC1 . . . EC16 may be the same size as S1 . . . S16. For example, if the symbols S1 . . . S16 are one byte each, then the symbols EC1 . . . EC16 may also be one byte each. The systematic erasure code symbols also include EC17 . . . ECn (ECk+1 . . . ECn), which do not correspond to any of S1 . . . Sk. In one embodiment, ECk+1 . . . ECn may be parity information. In another embodiment, ECk+1 . . . ECn may be other information that facilitates recreating the original message.

The original message 1000 can be recreated from any 16 of the systematic erasure code symbols EC1 . . . ECn. If EC1 . . . ECk are available, then original message 1000 can be recreated without performing erasure code decoding. If any of EC1 . . . ECk are not available, then original message 1000 can would be recreated but erasure code decoding would be necessary. If original message 1000 became more important, additional erasure code symbols (e.g., ECn+1 . . . ECn+y) may be computed using the same generator matrix. If original message 1000 became less important, then some of erasure code symbols EC1 . . . ECn may be logically or physically deleted.

Prior Art FIG. 11 illustrates an original message 1100 that also has sixteen symbols S1, S2, . . . S16 (k=16) and that reads "original message". While the symbol size is one character, different (e.g., larger) symbol sizes are likely to be employed. Message 1100 is provided to erasure encoder 1110. Erasure encoder 1110 uses a generator matrix 1120 to produce erasure code symbols 1130. In this example, erasure encoder 1110 produces non-systematic erasure code symbols EC1, EC2, . . . ECn (n>k). EC1, EC2, . . . ECn do not correspond directly to any of S1 . . . S16 as was the case for systematic erasure codes 1030 (FIG. 10). Instead, EC1, EC2, . . . ECn are the result of processing symbols S1 . . . S16 with the matrix 1120 as controlled by erasure encoder 1110.

FIG. 1 illustrates a system 100 that combines data deduplication and erasure coding. Data 110 is provided to a parser 120. Parser 120 produces chunks C1 . . . Ca. There may be duplicate chunks in C1 . . . Ca. The chunks C1 . . . Ca are provided to a deduplicator 130. Deduplicator 130 may consult and update metadata 132 and an index 134 to produce unique chunks U1 . . . Ub.

Unique chunks U1 . . . Ub are provided to erasure code generator 140. Erasure code generator 140 produces erasure code symbols EC1 . . . ECc based, at least in part, on information stored in generator matrix 142. Unique chunks U1 . . . Ub are protected by erasure codes and they are recoverable from erasure code symbols EC1 . . . ECc. In one embodiment, a rateless erasure code approach is employed to facilitate a complementary relationship between erasure coding and variable length data deduplication. The complementary relationship facilitates accounting for unique chunks having different values to the deduplication system. Rateless erasure codes, systematic erasure codes, systematic rateless erasure codes, or other erasure codes may be produced.

Erasure code symbols EC1 . . . ECc are provided to an erasure code distributor 150. Erasure code distributor 150 may distribute erasure code symbols EC1 . . . ECc to a number of different storage devices DS1 . . . DSd. While a storage system is illustrated, different embodiments may combine data deduplication with erasure coding in a communication system or other system. Data 110 may be, for example, a file, an object, a block, a stream, a binary large object (BLOB), or other item.

By performing deduplication before erasure coding, only unique data is encoded, which reduces the time required to perform erasure coding. By performing erasure coding after deduplication, unique chunks are protected by some redundancy, which facilitates mitigating the risk of removing redundant data. Protecting unique chunks using erasure coding may have the technical effect of allowing the use of less expensive (e.g., RAID-5, near line storage) storage systems instead of more expensive (e.g., RAID-6, enterprise storage) storage systems.

In one embodiment, using a rateless erasure code approach facilitates selectively and adaptively varying the level of data protection (e.g., erasure code approach) for different pieces of unique data. In one embodiment, the value of the unique data may be measured by the number of references to the unique data. For example, a segment of shared data that is present in several files may have more references to it and thus may be treated as being more valuable than a segment of shared data that is used in fewer files and thus has fewer references. While reference counts are described, other value measures may be employed (e.g., the number of bytes in the original file or unique data). Thus, the number (c) of erasure code symbols EC1 . . . ECc that are produced, the characteristics (e.g., size, composition) of the erasure code symbols EC1 . . . ECc that are produced, the distribution of the erasure code symbols EC1 . . . ECc that are produced, the type of erasure encoding (e.g., rateless, systematic), or other erasure code attributes may be manipulated based on an attribute (e.g., importance, size, number) of the unique chunks U1 . . . Ub. Since the attribute (e.g., importance, size, age) of the unique chunks may vary over time, in one embodiment, the number of erasure code symbols used to protect a unique chunk may be updated upon determining that the attribute has changed. For example, as reference counts to a chunk increase, the number of erasure code symbols used to protect the chunk may be increased.

Although a storage system is illustrated, example apparatus and methods may also be employed with a communication system. For example, metadata that tracks unique segments may be maintained at both a sender and a receiver. The metadata may be maintained for different periods of time to accommodate different history durations. Unique segments and the metadata (e.g., recipes) associated with recreating larger data objects (e.g., files) from the unique segments may be encoded by a transmitter and provided to a receiver. In one embodiment, the recipes may be encoded and provided, which prompts a receiver to identify segments that are desired, which in turn prompts encoding and providing the erasure code symbols for the desired segments.

Figure 2:
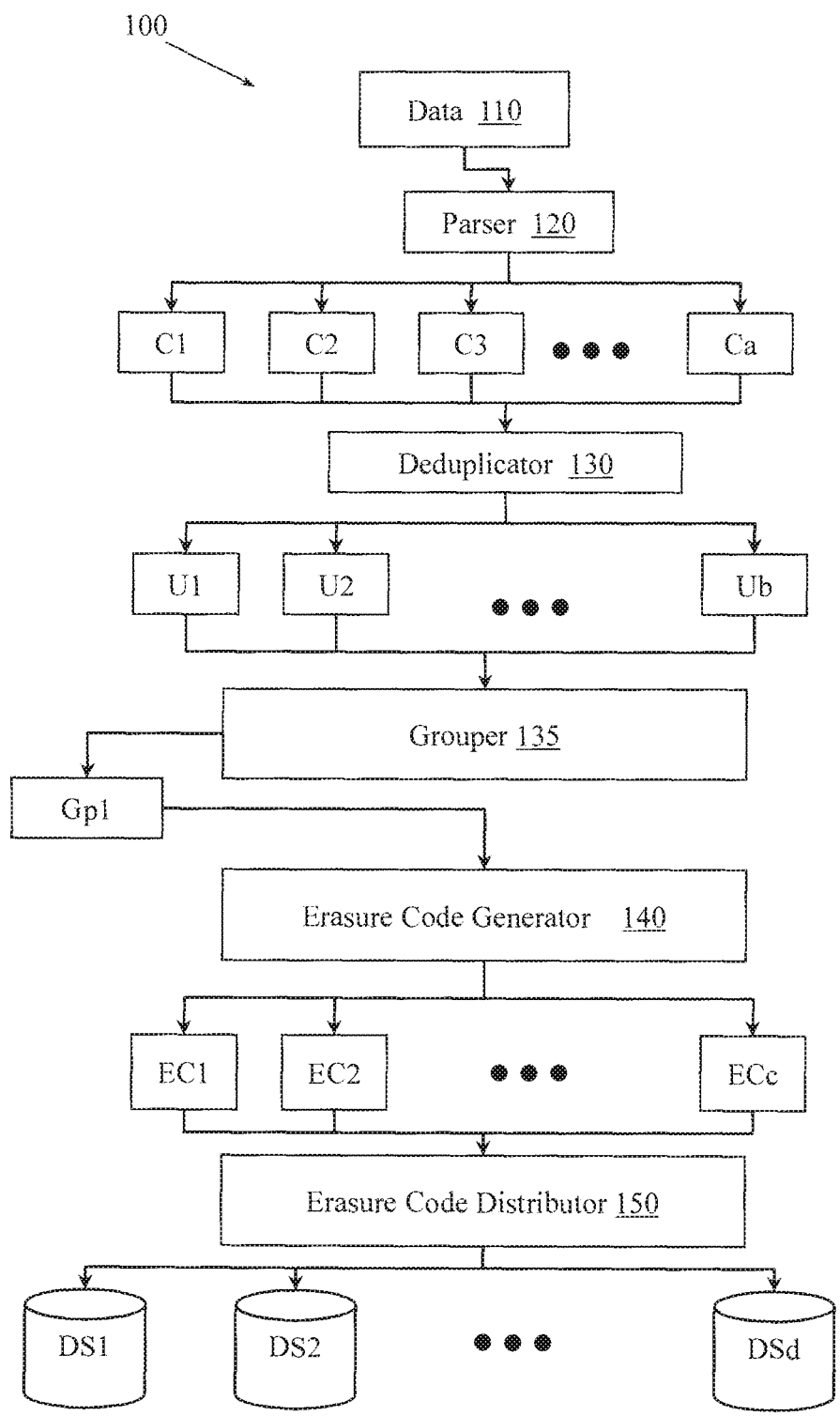
FIG. 2 illustrates another example of protecting unique chunks produced by a data deduplication system using erasure code redundancy, where unique chunks are grouped together before being provided to an erasure coding system.

FIG. 2 illustrates another example of system 100 where unique chunks U1 . . . Ub are protected by erasure code symbols EC1 . . . ECc. In this example, the unique chunks U1 . . . Ub are grouped together by grouper 135 into group Gp1 before being provided to erasure code generator 140. Having larger inputs to erasure code generator 140 may facilitate improving certain erasure code properties. For example, rateless codes incur less overhead penalty with larger block lengths and only have linear time complexity operation.

Figure 3:
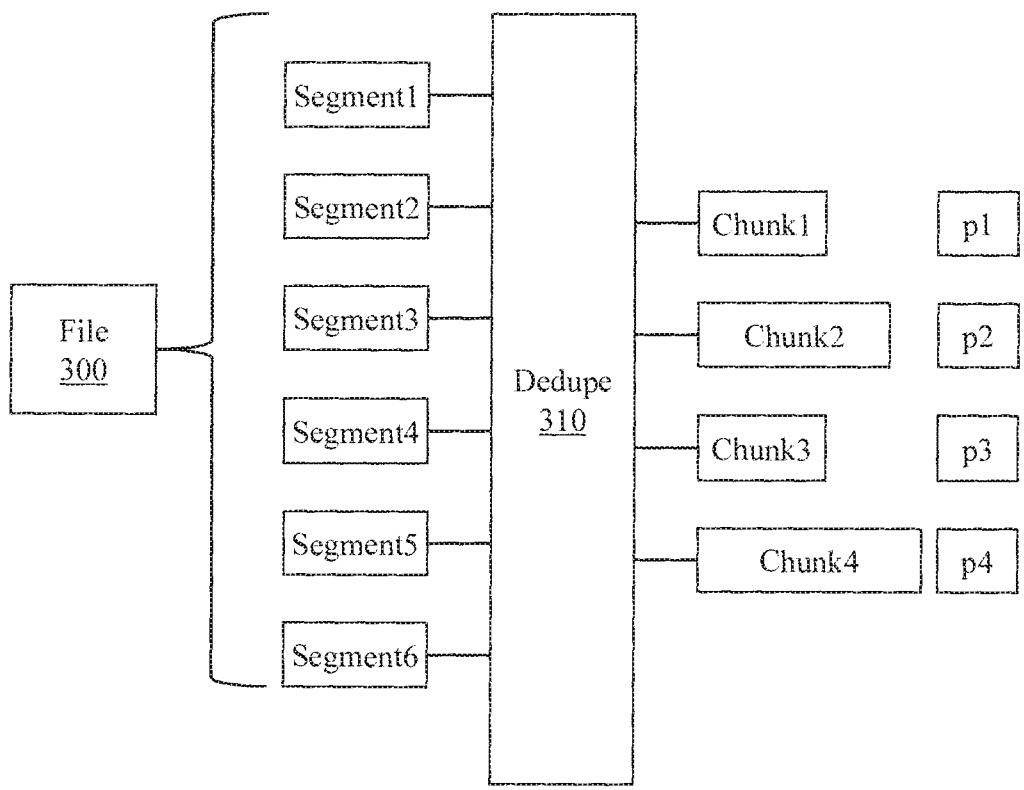
FIG. 3 illustrates a file segmented into parts and deduplicated before erasure coding.

FIG. 3 illustrates a file 300 that has been segmented into segments segment1 . . . segment6. The segments segment1 . . . segment6 are provided to a deduplication apparatus or method 310. Deduplication apparatus or method 310 produces four unique chunks, chunk1 . . . chunk4. There may be different numbers of reference counts to the different unique chunks. The chunks may have different chunk-level probabilities $\{p_1, p_2 \ldots p_4\}$. The segments may have the same or different user-defined attributes (e.g., value metrics, size).

Figure 4:
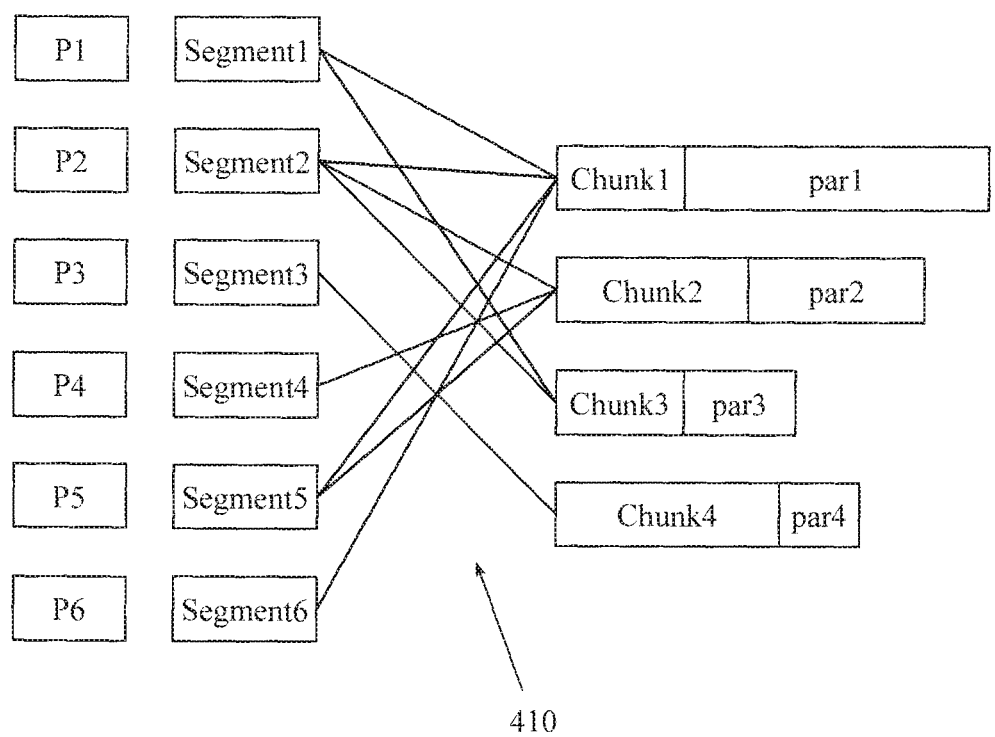
FIG. 4 illustrates a file segmented into parts that have been deduplicated and had erasure correction parities added.

FIG. 4 illustrates that the segments segment1 . . . segment6 may be characterized by different failure probabilities $\{P_1, P_2 \ldots P_6\}$. After deduplication, the reconstruction quality profile for a segment may change based, for example, on reference counts or other metadata. The reference counts are illustrated using a bipartite graph in which the graph connections 410 establish which segment contains which chunk in a storage pool of chunks. The set of probabilities $\{P_1, P_2 \ldots P_6\}$ may induce different chunk-level probabilities $\{p_1, p_2 \ldots p_4\}$. In one embodiment, chunk-level probabilities may then be constrained to satisfy an example set of inequalities:

$$1-(1-p_1)(1-p_3) <= P_1$$

$$1-(1-p_2)(1-p_2)(1-p_3) <= P_2$$

. . .

Note that even if $P_i$ are the same, the $p_j$ can still be different. Based on $\{P_1, P_2 \ldots P_6\}$ and the set of inequalities, chunk level recovery can be guaranteed by calculating the appropriate set $\{p_1, p_2 \ldots p_4\}$. An erasure coding mechanism can be manipulated to protect these chunks at a level appropriate to the chunk-level probability requirements. Different erasure coding approaches can be applied to different chunks having different chunk-level probability requirements. For example, chunk1 has more connections (e.g., 4) than any other chunk in the pool. In an example parity based systematic EC approach, more parity may be allocated for chunk1 in the erasure coding phase. The amount of parity par1 allocated for chunk1 may be larger than the amount of parity par2 allocated for chunk2, the amount of parity par3 allocated for chunk3, or the amount of parity par4 allocated for chunk4. The amount of parity allocated for a chunk may be proportional to an attribute (e.g., number of connections) of the chunk. More generally, variable size chunks having varying sensitivity to loss may be protected using different numbers of parity symbols in a systematic erasure code approach. Even more generally, chunks having different attributes may be protected differently by controlling attributes of an erasure coding approach. The attributes of an erasure coding approach (e.g., number of parity symbols employed) may vary over time as the attribute of the chunk (e.g., number of connections) varies over time.

Figure 5:
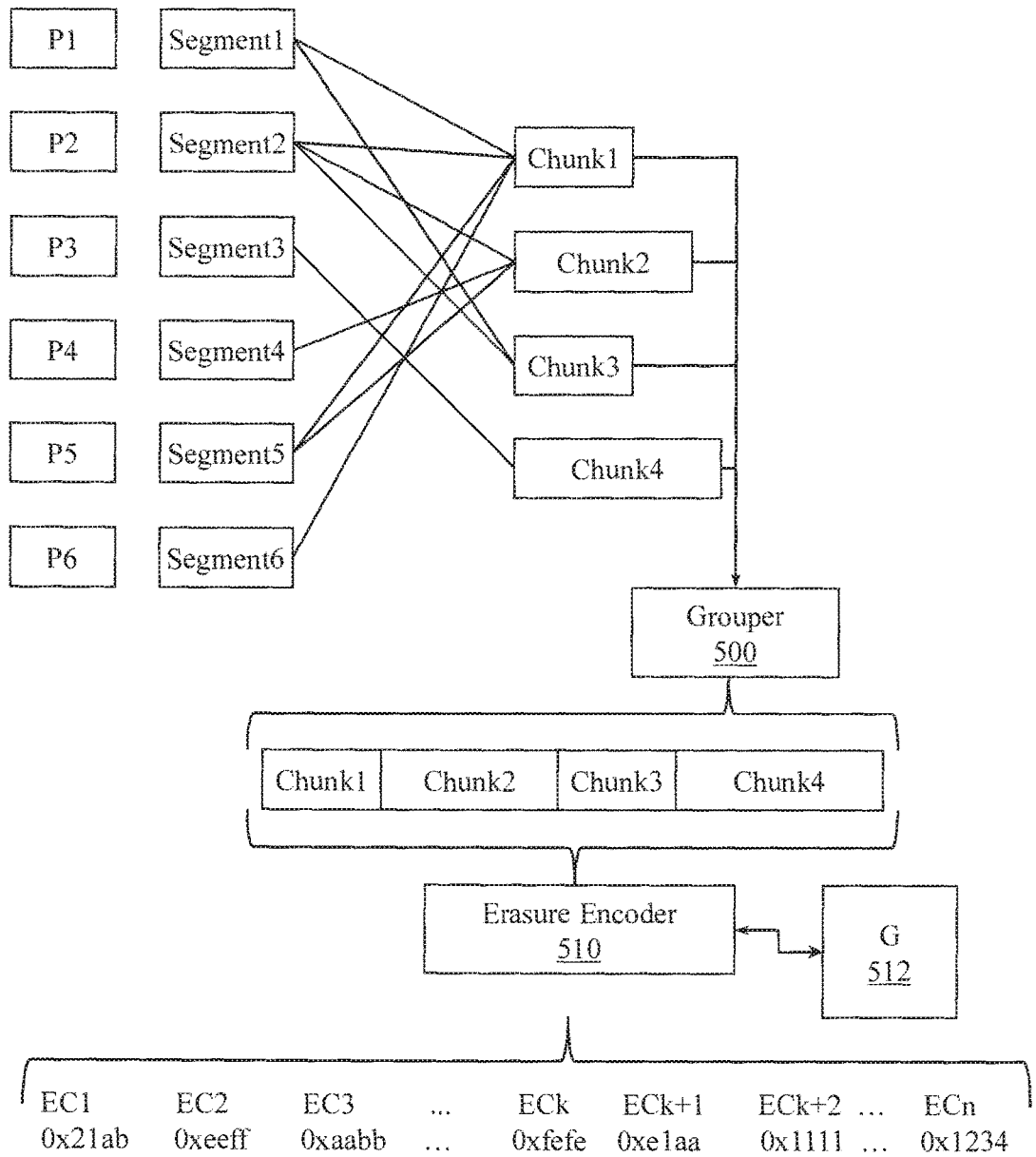
FIG. 5 illustrates grouping chunks before erasure coding.

FIG. 5 illustrates the segments segment1 . . . segment6 and the unique chunks chunk1 . . . chunk4 of FIG. 3. In one example that uses rateless codes, example apparatus and methods may keep the rateless codeword length above a certain threshold by grouping the unique chunks before erasure coding. Recall that rateless codes incur less overhead penalty with larger block lengths and only have linear time complexity operation. Thus, in one embodiment, deduplicated chunks chunk1 . . . chunk4 may be grouped together (e.g., concatenated) by grouper 500 to produce a single data item to be encoded by erasure encoder 510. In one embodiment, erasure encoder 510 may use a rateless erasure code process. In one embodiment, when deduplicated data exceeds a threshold size, example apparatus and methods may control erasure encoder 510 to use code words that are larger than a threshold size to facilitate accounting for random failures and thus improve performance of the storage network.

The grouped chunks are encoded by erasure encoder 510 to generate a desired number of EC symbols. Erasure encoder 510 builds EC symbols EC1 . . . ECn from the group as processed in light of generator matrix 512. To meet desired protection guarantees (e.g., probabilities $\{p_1, p_2 \ldots p_4\}$) the rateless encoder algorithm applied by erasure encoder 510 may be controlled. In one embodiment, a graph defining the properties of the rateless code would make more connections with the higher valued content in the concatenation to increase recoverability of that higher valued content. In one embodiment, node/edge probability distributions realized as non-zero entries in the generator matrix 512 representation of an encoding graph may be manipulated to allow error probabilities less than or equal to $\{p_1, p_2 \ldots p_4\}$. More generally, attributes of erasure codes produced by erasure encoder 510 may be controlled by manipulating the generator matrix 512 employed by the erasure encoder 510. For example, the composition of an erasure code (e.g., number of connections between a portion of the message and an erasure codeword) can be controlled by the construction of the generator matrix 512, which can be manipulated by attributes (e.g., desired probabilities p1 . . . p4) of unique chunks.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
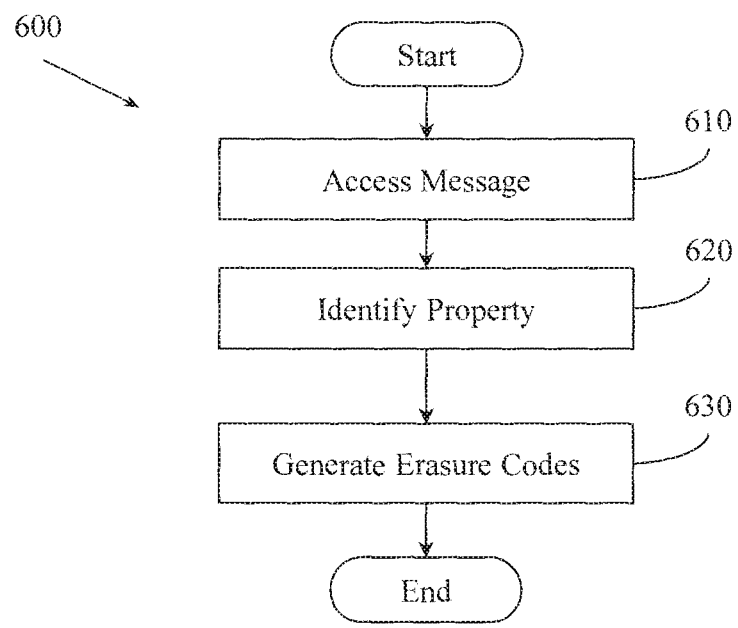
FIG. 6 illustrates an example method associated with protecting a data deduplication system using erasure code redundancy.

FIG. 6 illustrates a method 600 associated with protecting a data deduplication system using erasure code redundancy. Method 600 may include, at 610, accessing a message produced by a data deduplication system. The message may be, for example, a unique chunk, a collection (e.g., grouping, concatenation) of unique chunks, or other data. The data deduplication system may be, for example, a variable-length, block-level system. Other types of deduplication systems (e.g., fixed length) may also be employed. Accessing the message may include receiving the message as a parameter in a function call, reading the message from a memory, receiving a pointer to the message, or other electronic data processing action.

Method 600 may also include, at 620, identifying a property of the message. The property may be, for example, the importance of the message to the data deduplication system. The importance of the message may be user-assigned or may be derived from, for example, the number of items that reference the message. The importance of the message may vary over time, therefore, in one embodiment, portions of method 600 may be repeated or values produced by method 600 may be recalculated.

Method 600 may also include, at 630, generating W erasure code symbols for the message. The erasure code symbols are generated according to an X/Y erasure code policy, where W, X and Y are numbers (e.g., integers). W is greater than or equal to X, meaning that at least X erasure code symbols will be produced. W is less than or equal to Y, meaning that not all Y possible erasure code symbols may be produced. Unlike conventional systems where W, X, and Y are fixed, in method 600, W, X or Y depend, at least in part, on the property (e.g., importance) of the message. In one embodiment, W, X, or Y are directly proportional to the property. For example, as the importance of the message increases, W, X, or Y may also increase. Over time, as the importance of the message increases or decreases, W, X, or Y may be increased or decreased and additional erasure code symbols may be generated and stored or some original erasure code symbols may be deleted.

Conventional methods typically have fixed erasure code symbol sizes. Method 600 is not so limited. In one embodiment, the size of an erasure code symbol in the W erasure code symbols is a function of the size of the message. For example, as the message size increases, the size of an erasure code symbol may increase.

Once the erasure code symbols have been created, they may be stored to add back the redundancy created by the erasure code approach to protect the message. Thus, method 600 may also include distributing members of the W erasure code symbols to Z different data stores according to a distribution policy. Z is a number and may be less than or equal to Y. For example, in a 10/16 policy, the erasure code symbols that are produced may be distributed to a number Z of devices, and the number Z may depend, at least in part, on the property.

Method 600 may use different types of erasure codes. For example, method 600 may use systematic erasure codes, rateless erasure codes, or other types of erasure codes. In one embodiment, the systematic erasure codes may be at least partially parity based. In this embodiment, the amount of parity generated by the X/Y erasure code policy depends, at least in part, on the property. For example, for more important messages there may be more parity symbols produced while for less important messages there may be fewer parity symbols produced.

How X, Y, or Z are chosen may depend on user configuration. The user may define rules that relate the property to a configurable attribute (e.g., X, Y, Z). In one embodiment, a relationship between the property and the X/Y erasure code policy is controlled, at least in part, by a user-defined rule. For example, a user may mandate that for messages with less than three references that a 10/14 policy be employed while for messages with three or more references that a 10/16 policy be employed. In another embodiment, a relationship between the property and the X/Y erasure code policy is controlled, at least in part by an automated rule. For example, the automated rule may cause Y to be set to a first value if the number of references for the message is in the bottom half of all reference counts for all messages encountered and may cause Y to be set to a second value if the number of references is in the top half of the reference counts encountered.

Figure 7:
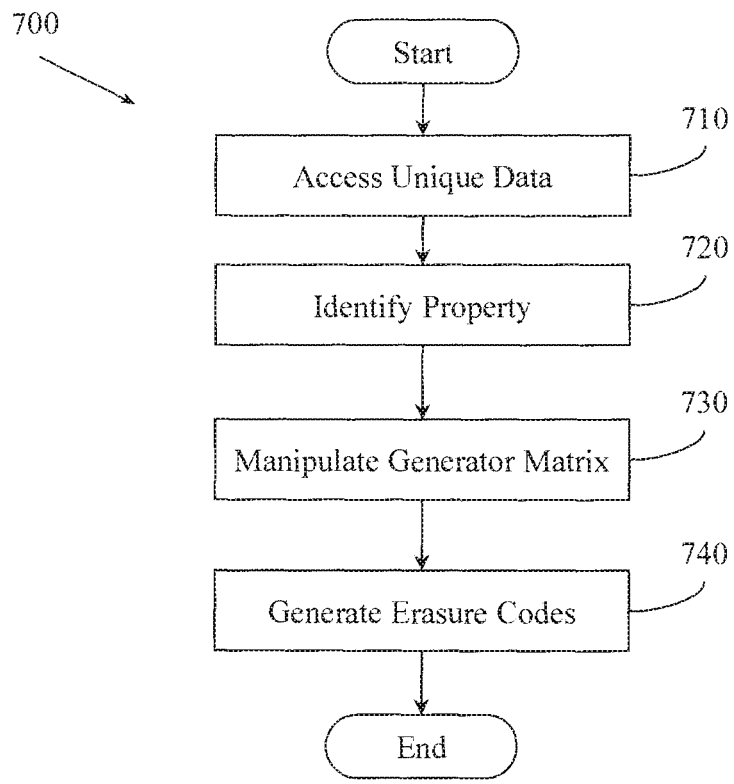
FIG. 7 illustrates an example method associated with manipulating a generator matrix used by an erasure encoder to protect data produced by a data deduplication system.

FIG. 7 illustrates an example method 700. Method 700 includes, at 710, accessing unique data produced by a data deduplication system. Accessing the unique data may include reading from a file, reading from a device, receiving a network data communication, receiving a pointer to data, or other actions.

Method 700 also includes, at 720, identifying a property of the unique data. The property may be, for example, an importance of the unique data. The importance may be derived from, for example, a reference count to the unique data. The property may also be, for example, an amount that a user is willing to spend to protect the data. In one embodiment, the property may be an intrinsic value of the unique data including, for example, the number of symbols in the unique data, the symbol size in the unique data, the age of the unique data, or other values.

Method 700 also includes, at 730, manipulating a generator matrix representation of an encoding graph associated with an erasure encoder. The manipulating may be based on the property. Manipulating the generator matrix may include controlling a number of non-zero elements in the generator matrix or controlling the value of one or more non-zero elements in the generator matrix. For example, a generator matrix may be an N×K matrix of values that are used to produce erasure code symbols from symbols in an input message. N or K may be selected based on the property. For systematic erasure codes, the upper portion of the matrix may be an identity matrix.

In one embodiment, the property of the unique data is a probability of failure associated with the unique data. In this embodiment, the number of non-zero elements as well as the number of rows N in the generator matrix may be controlled to cause erasure codewords produced by the erasure encoder to account for chunk level probability requirements associated with the unique data. In one embodiment, the value of one or more non-zero elements in the generator matrix may be controlled to cause erasure code symbols produced by the erasure encoder to account for chunk level probability requirements associated with the unique data.

The generator matrix may be manipulated to cause erasure code symbols to have different properties. For example, manipulating the generator matrix may control, at least in part, the size or composition of an erasure codeword produced by the erasure encoder. The composition of an erasure codeword may in turn control, at least in part, the relevance of an erasure codeword to a selected portion of the unique data. For example, in a rateless erasure code approach, chunks having higher probability requirements may have more connections to an erasure codeword while chunks having lower probability requirements may have fewer connections to an erasure codeword. This enables adapting the erasure code according to the recoverability requirements of different chunks.

Method 700 may also include, at 740, generating erasure codewords from the unique data based, at least in part, on the generator matrix. Generating erasure codewords may include mathematically oversampling the unique data with values in the generator matrix.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
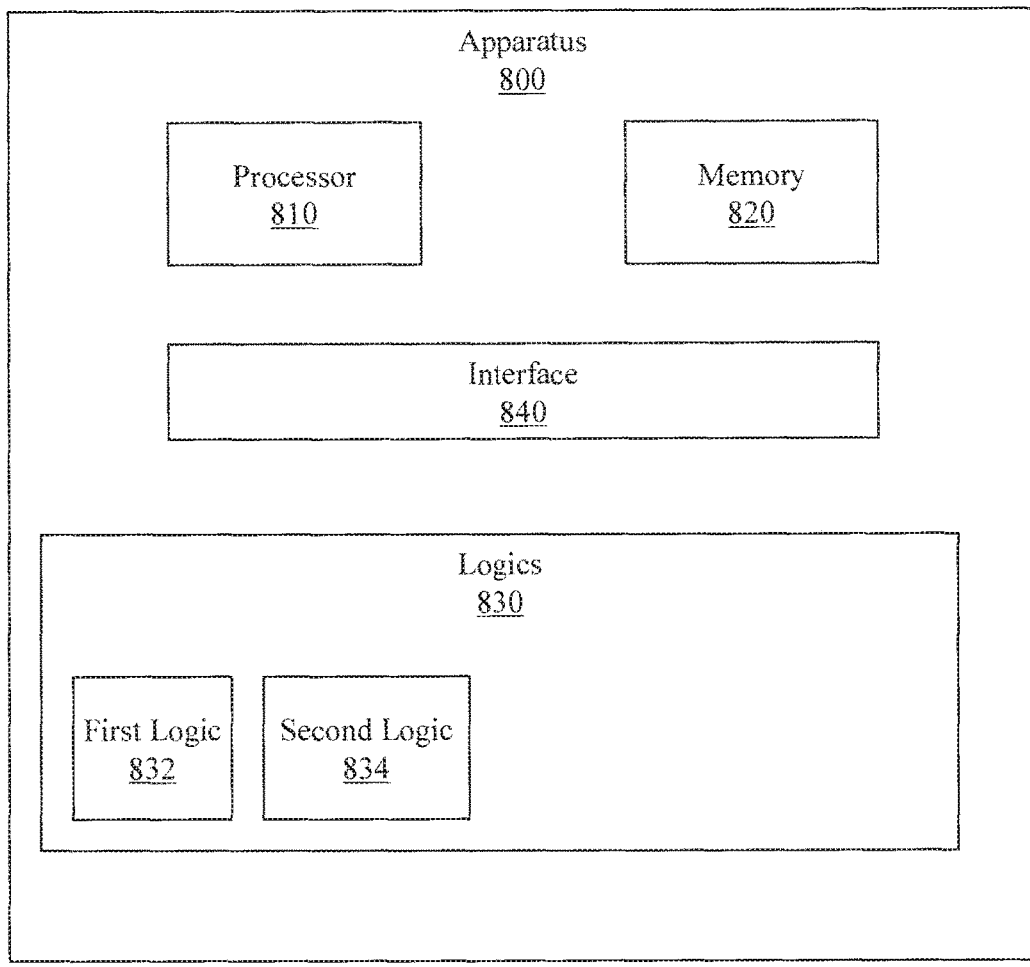
FIG. 8 illustrates an example apparatus for protecting a data deduplication system using erasure code redundancy.

FIG. 8 illustrates an apparatus 800 that includes a processor 810, a memory 820, and a set 830 of logics that is connected to the processor 810 and memory 820 by an interface 840. In one embodiment, the apparatus 800 may be a stand-alone device connected to a data communication network. In another embodiment, apparatus 800 may be integrated into another device (e.g., deduplication apparatus) or system (e.g., object storage system).

The set 830 of logics may include a first logic 832 that produces a set of n erasure code symbols for a message received from a data deduplication system. The message may be, for example, a unique chunk, a collection (e.g., concatenation) of unique chunks, or other data to be protected. The message has k symbols. n and k are numbers and n>k. Unlike conventional systems, n is a function of a first attribute of the message.

The first attribute may describe, for example, an importance of the message to the data deduplication system. The importance may be determined by the number of references to the message, by a user-defined value assigned to the message, by a cost to replace the message, or in other ways. The first attribute may also describe, for example, the size of the message, an amount to be spent protecting the message, an age of the message, or other properties. The value of the first attribute may vary over time.

The apparatus 800 may also include a second logic 834 that selectively stores members of the n erasure code symbols on z different data storage devices. z is a function of a second attribute of the message. The second attribute may also describe, for example, the importance of the message or another property of the message (e.g., size, age, cost to replace, user-assigned value). The value of the second attribute may vary over time.

Different types of erasure codewords may be produced. In one embodiment, the type of erasure codewords produced is a function of the first attribute. The erasure codes may be, for example, systematic erasure codes, rateless erasure codes, or other erasure codes. In one embodiment, the size of an erasure code symbol is a function of the size of the k symbols. For example, message symbols that are sixteen bytes wide may yield erasure code symbols that are twenty bytes wide. In different embodiments the size of the erasure code symbol may be the same as the size of the k symbols or may be different than the size of the k symbols. In one embodiment, the composition of an erasure code symbol is a function of the first attribute or the second attribute. The composition of the erasure code symbol may allocate a certain amount of the erasure code symbols to a certain portion of the message and may allocate another amount of the erasure code symbols to another portion of the message.

Figure 9:
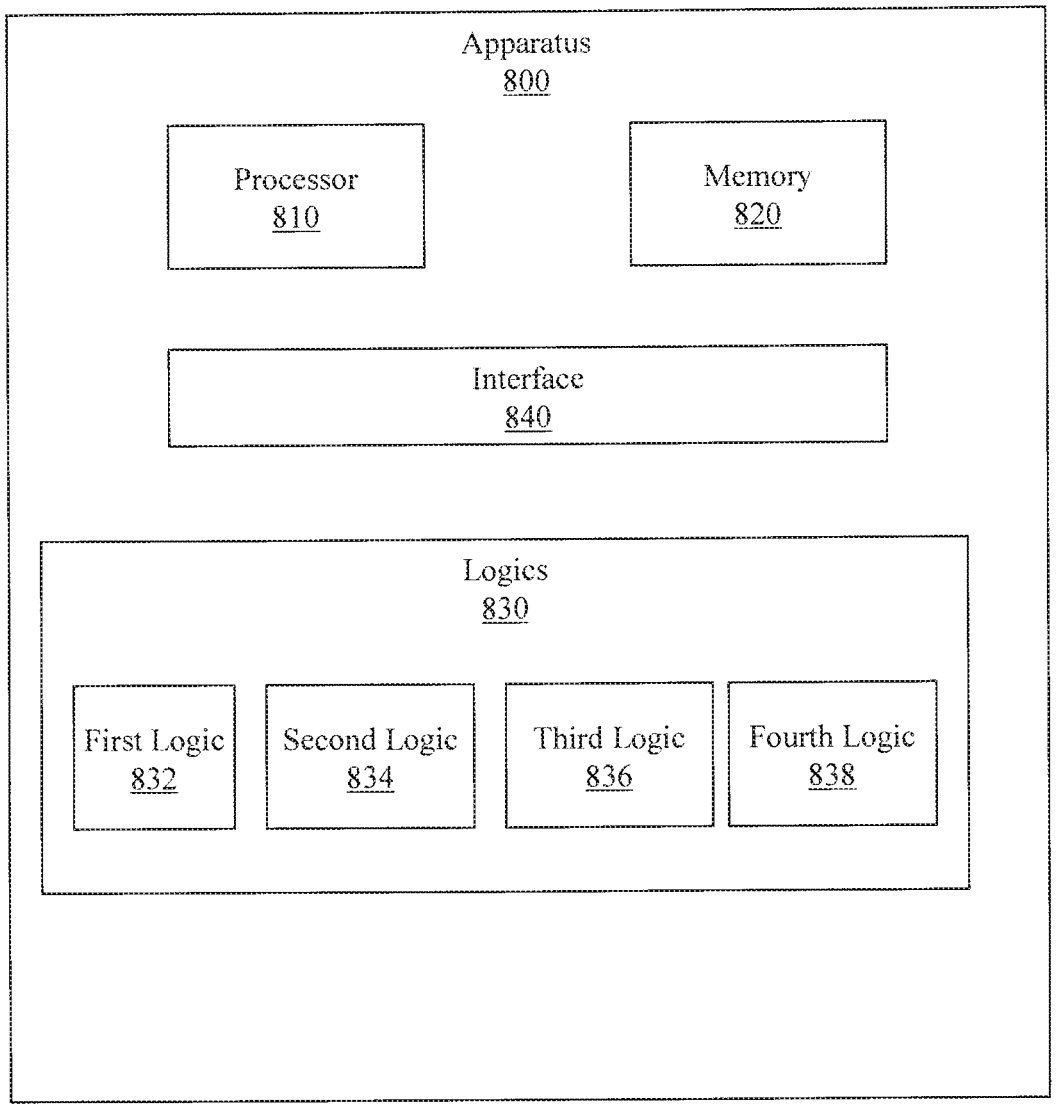
FIG. 9 illustrates an example apparatus for protecting a data deduplication system using erasure code redundancy.

FIG. 9 illustrates another embodiment of apparatus 800. This embodiment includes a third logic 836. The third logic 836 may adapt how n is selected as a function of the first attribute. For example, over time, a metric that measures overall redundancy in a system may report that apparatus 800 is producing redundancy above a threshold level. In this case, n may be reduced for certain values of the first attribute. In another example, a metric that measures overall resource usage for storing data may report that apparatus 800 is only consuming half of the available resources. In this case, n may be increased for certain values of the first attribute.

This embodiment also includes a fourth logic 838. The fourth logic 838 may adapt how z is selected as a function of the second attribute. For example, over time, a failure rate for the z devices on which erasure code symbols are being stored may be tracked. If the failure rate is above a certain threshold, then z may be increased to decrease the impact of any single failure.

In one embodiment, the first logic 832 or the second logic 834 may be controlled to recalculate n or z for a message upon determining that the first attribute or the second attribute for the message has changed more than a threshold amount.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer-executable instructions that when executed by a computer control the computer to perform a method, the method comprising:
   generating, by a processor, a characterization of segments of a plurality of segments with failure probabilities associated with the segments that indicate a likelihood of failure of the segments;
   parsing, by a processor, the plurality of segments to generate a plurality of original chunks;
   deduplicating, by a processor, the plurality of original chunks to generate a plurality of unique chunks;
   grouping, by a processor, the plurality of unique chunks to form grouped chunks;
   encoding, by a processor, the grouped chunks to generate a desired number of erasure code symbols that satisfy the failure probabilities associated with the segments; and
   selectively storing members of the desired number of erasure code symbols on a number of storage devices.

2. The non-transitory computer-readable storage medium of claim 1, further comprising:
   calculating, by a processor, attributes of unique chunks of the plurality of unique chunks based, at least in part, on the failure probabilities; and where the encoding is based, at least in part, on the attributes being constrained by the failure probabilities.

3. The non-transitory computer-readable storage medium of claim 2, where importance is an attribute of the attributes, and where importance is calculated based on a reference count to the data in a unique chunk.

4. The non-transitory computer-readable storage medium of claim 2, where the attributes are variable, and where the desired number of erasure code symbols changes when an attribute changes.

5. The non-transitory computer-readable storage medium of claim 2, where the number of storage devices is based, at least in part, on the attributes of the unique chunks.

6. The non-transitory computer-readable storage medium of claim 1, where an erasure code symbol represents a number of connections between at least one segment and an erasure code symbol.

7. The non-transitory computer-readable storage medium of claim 1, where the encoding is based on information stored in a generator matrix, and the method further comprising:
   identifying, by a processor, attributes of unique chunks of the plurality of unique chunks; and
   manipulating, by a processor, the generator matrix to control, at least in part, a size or composition of an erasure code symbol of the desired number of erasure code symbols.

8. A method comprising:
   generating, by a processor, a characterization of segments of a plurality of segments with failure probabilities associated with the segments that indicate a likelihood of failure of the segments;
   parsing, by a processor, the plurality of segments to generate a plurality of original chunks,
   deduplicating, by a processor, the plurality of original chunks to generate a plurality of unique chunks;

calculating, by a processor, attributes of unique chunks of the plurality of unique chunks based, at least in part, on the failure probabilities associated with corresponding segments;

grouping, by a processor, the plurality of unique chunks to form a grouped chunk;

encoding, by a processor, the grouped chunk to generate a desired number of erasure code symbols based, at least in part, on the attributes being constrained by the failure probabilities; and selectively storing members of the desired number of erasure code symbols on a number of storage devices, where the number of storage devices is based, at least in part, on the attributes for the unique chunks.

9. The method of claim 8, where the attributes include an importance of a unique chunk, a size of the unique chunk, or an age of the unique chunk.

10. The method of claim 8, where importance is an attribute, and where importance is calculated, by a processor, based on a reference count to the data in a unique chunk.

11. The method of claim 8, where the attributes are variable, and where the desired number of erasure code symbols changes when an attribute changes.

12. The method of claim 8, where the desired number of erasure code symbols is greater than or equal to a minimum threshold of erasure code symbols but less than the total possible erasure codes.

13. The method of claim 12, where the desired number of erasure code symbols, the minimum threshold of erasure code symbols, and the total possible erasure codes are directly proportional to a variation of the attributes.

14. The method of claim 8, where the encoding is based on information stored in a generator matrix, the method further comprising:

identifying, by a processor, attributes of unique chunks of the plurality unique chunks; and manipulating, by a processor, the generator matrix to control, at least in part, a size or composition of an erasure code symbol of the desired number of erasure code symbols.

15. An apparatus, comprising:
a number of storage devices; and
a processor configured to:

generate a characterization of segments of a plurality of segments with failure probabilities associated with the segments that indicate a likelihood of failure of segments;

parse the plurality of segments to generate a plurality of original chunks, deduplicate the plurality of original chunks to generate a plurality of unique chunks;

calculate attributes of unique chunks of the plurality of unique chunks based, at least in part, on the failure probabilities;

group the plurality of unique chunks to form at least one grouped chunk;

encode the at least one grouped chunk to generate a desired number of erasure code symbols that satisfy the failure probabilities associated with the segments, where the encoding is based, at least in part, on the attributes being constrained by the failure probabilities; and selectively store members of the desired number of erasure code symbols on the number of storage devices, where the number of storage devices is based, at least in part, on the attributes for the unique chunks.

16. The apparatus of claim 15, where importance is an attribute of the attributes, and where importance is calculated based on a reference count to the data in a unique chunk.

17. The apparatus of claim 15, where the attributes are variable, and where the desired number of erasure code symbols changes when an attribute changes.

18. The apparatus of claim 15, where an erasure code symbol represents a number of connections between at least one segment and an erasure code symbol.

19. The apparatus of claim 15, where the encoding is based on information stored in a generator matrix, and where the processor is further configured to:

identify attributes of unique chunks of the plurality unique chunks; and manipulate the generator matrix to control, at least in part, a size or composition of an erasure code symbol of the desired number of erasure code symbols.

20. The apparatus of claim 19, where a non-zero entry in the generator matrix represents a node/edge probability distribution.

* * * * *